(12) United States Patent
Ready

(10) Patent No.: US 8,350,146 B2
(45) Date of Patent: Jan. 8, 2013

(54) THREE DIMENSIONAL MULTI-JUNCTION PHOTOVOLTAIC DEVICE

(75) Inventor: William Judson Ready, Atlanta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 875 days.

(21) Appl. No.: 11/817,469

(22) PCT Filed: Feb. 28, 2006

(86) PCT No.: PCT/US2006/007290
§ 371 (c)(1),
(2), (4) Date: Sep. 11, 2007

(87) PCT Pub. No.: WO2007/040594
PCT Pub. Date: Apr. 12, 2007

(65) Prior Publication Data
US 2008/0251122 A1    Oct. 16, 2008

Related U.S. Application Data

(60) Provisional application No. 60/663,389, filed on Mar. 18, 2005, provisional application No. 60/657,486, filed on Mar. 1, 2005.

(51) Int. Cl.
*H01L 31/0236* (2006.01)

(52) U.S. Cl. .................................. 136/256; 136/264

(58) Field of Classification Search ........... 136/243–265
See application file for complete search history.

(56) References Cited

U.S. PATENT DOCUMENTS

| 3,969,746 A | * | 7/1976 | Kendall et al. | 136/255 |
| 4,155,781 A | * | 5/1979 | Diepers | 438/57 |
| 6,649,824 B1 | * | 11/2003 | Den et al. | 136/256 |

(Continued)

FOREIGN PATENT DOCUMENTS

| JP | 6104463 A | 4/1994 |
| JP | 9237907 A | 9/1997 |
| KR | 2005-4360 | 1/2005 |
| WO | WO 2004044948 A2 * | 5/2004 |

OTHER PUBLICATIONS

Wagner et al., Band-gap narrowing in heavily doped silicon: a comparison of optical and electrical data, Journal of Applied Physics, vol. 63, No. 2, pp. 425-429, Jan. 15, 1988.*

(Continued)

*Primary Examiner* — Kevin P Kerns
*Assistant Examiner* — Kevin E Yoon
(74) *Attorney, Agent, or Firm* — The Marbury Law Group, PLLC

(57) ABSTRACT

A photovoltaic device may be provided. The photovoltaic device may include a first energy absorbing surface and a second energy absorbing surface being substantially parallel to the first energy absorbing surface. The photovoltaic device may include a third energy absorbing surface being substantially perpendicular to the first energy absorbing surface and the second energy absorbing surface. Each of the first energy absorbing surface, the second energy absorbing surface, and the third energy absorbing surface may be configured to convert energy from photons into electrical energy. The photons may be impinging one or more of the first energy absorbing surface, the second energy absorbing surface, and the third energy absorbing surface. The first, second, and the third energy absorbing surfaces may be oriented in manner to cause the photons to bounce between two or more of the first energy absorbing surface, the second energy absorbing surface, and the third energy absorbing surface.

23 Claims, 7 Drawing Sheets

U.S. PATENT DOCUMENTS

| | | |
|---|---|---|
| 7,265,037 B2 | 9/2007 | Yang et al. |
| 7,589,880 B2 | 9/2009 | Kempa et al. |
| 7,649,665 B2 | 1/2010 | Kempa et al. |
| 7,754,964 B2 | 7/2010 | Kempa et al. |
| 7,943,847 B2 | 5/2011 | Kempa et al. |
| 2004/0112421 A1* | 6/2004 | Spivack et al. ............... 136/256 |
| 2005/0121068 A1* | 6/2005 | Sager et al. .................. 136/252 |
| 2007/0025139 A1 | 2/2007 | Parsons |
| 2007/0240757 A1 | 10/2007 | Ren et al. |
| 2011/0308564 A1 | 12/2011 | Kempa et al. |

OTHER PUBLICATIONS

Examination Report issued by the Korean Patent Office dated Apr. 23, 2009 for related application No. KR 10-2007-7022061.

Canadian Office Action from application No. 2,598,490 dated Jun. 27, 2012.

Japanese Office Action from application No. 2007-558183 dated May 29, 2012 (no translation).

* cited by examiner

THREE DIMENSIONAL MULTI-JUNCTION PHOTOVOLTAIC DEVICE

This application is a United States National Stage Application of International Patent Application No. PCT/US2006/007290, filed 28 Feb. 2006, in the name of Georgia Tech Research Corporation, a U.S. national corporation, applicant for the designation of all countries except the U.S., and William Judson Ready, a citizen of the U.S., applicant for the designation of the U.S. only, and claims priority to U.S. Provisional Application Ser. No. 60/657,486, filed 1 Mar. 2005, and U.S. Provisional Application Ser. No. 60/663,389, filed 18 Mar. 2005, all three of which are hereby incorporated by reference in their entireties.

BACKGROUND

Photovoltaic solar cells tap the sun's limitless energy. Tapping such a limitless energy source could remedy the world's many energy dilemmas. Photovoltaic cells, for example, absorb energy from light and convert the absorbed energy to an electrical current. As shown in FIG. 1, in a conventional (e.g. planar) single-junction solar cell 100, a light photon 105 from sun 110 impinges a p/n-junction 115 at a single instance. This impingement creates a single electron-hole pair in p/n-junction 115. However, as shown in FIG. 1, unabsorbed photons 120 reflect into the atmosphere or space.

Conventional single solar cells are typically small wafers approximately six inches across. These solar cells may be first arranged into modules and then large photovoltaic arrays that may cover dozens of square meters in order to satisfy specific power needs.

Thus, the conventional strategy is to absorb energy from light photons that impinge a solar cell at a single impingement instance. Then energy from this single impingement is then converted to an electrical current by the solar cell. This often causes problems because the conventional strategy absorbs only a small amount of the available energy. For example, the conventional strategy reflects unabsorbed energy into the atmosphere or space.

SUMMARY

A three dimensional multi-junction photovoltaic device may be provided. This Summary is provided to introduce a selection of concepts in a simplified form that are further described below in the Detailed Description. This Summary is not intended to identify key features or essential features of the claimed subject matter. Nor is this Summary intended to be used to limit the scope of the claimed subject matter.

In accordance with one embodiment, a photovoltaic device may comprise a first energy absorbing element configured to convert energy from a photon impinging the first energy absorbing element into a first electrical current. Furthermore, the photovoltaic device may comprise a second energy absorbing element being oriented with the first energy absorbing element in a non-parallel manner. The second energy absorbing element may be configured to convert energy from the photon impinging the second energy absorbing element into a second electrical current. The photon impinging the second energy absorbing element may do so after the photon impinged the first energy absorbing element.

According to another embodiment, a photovoltaic device may comprise a first energy absorbing surface and a second energy absorbing being substantially parallel to the first energy absorbing surface. The photovoltaic device may further comprise a third energy absorbing surface being substantially perpendicular to the first energy absorbing surface and the second energy absorbing surface. Each of the first energy absorbing surface, the second energy absorbing surface, and the third energy absorbing surface may be configured to convert energy from photons into electrical energy. The photons may be impinging one or more of the first energy absorbing surface, the second energy absorbing surface, and the third energy absorbing surface. The first energy absorbing surface, the second energy absorbing surface, and the third energy absorbing surface may be oriented in manner to cause the photons to bounce between two or more of the first energy absorbing surface, the second energy absorbing surface, and the third energy absorbing surface.

In accordance with yet another embodiment, a method for providing a photovoltaic device may comprise providing a substrate comprising a third energy absorbing surface. The method may further comprise providing a first carbon nanotube on the substrate and providing a second carbon nanotube on the substrate. In addition, the method may include coating the first carbon nanotube with a first energy absorbing surface and coating the second carbon nanotube with a second energy absorbing surface. Each of the first energy absorbing surface, the second energy absorbing surface, and the third energy absorbing surface may be configured to convert energy from photons into electrical energy. The photons may be impinging one or more of the first energy absorbing surface, the second energy absorbing surface, and the third energy absorbing surface. The first energy absorbing surface, the second energy absorbing surface, and the third energy absorbing surface may be oriented in manner to cause the photons to bounce between two or more of the first energy absorbing surface, the second energy absorbing surface, and the third energy absorbing surface.

Both the foregoing general description and the following detailed description provide examples and are explanatory only. Accordingly, the foregoing general description and the following detailed description should not be considered to be restrictive. Further, features or variations may be provided in addition to those set forth herein. For example, embodiments may be directed to various feature combinations and subcombinations described in the detailed description.

BRIEF DESCRIPTION OF THE DRAWINGS

The accompanying drawings, which are incorporated in and constitute a part of this disclosure, illustrate various embodiments of the present invention. In the drawings.

DETAILED DESCRIPTION

Figure 1:
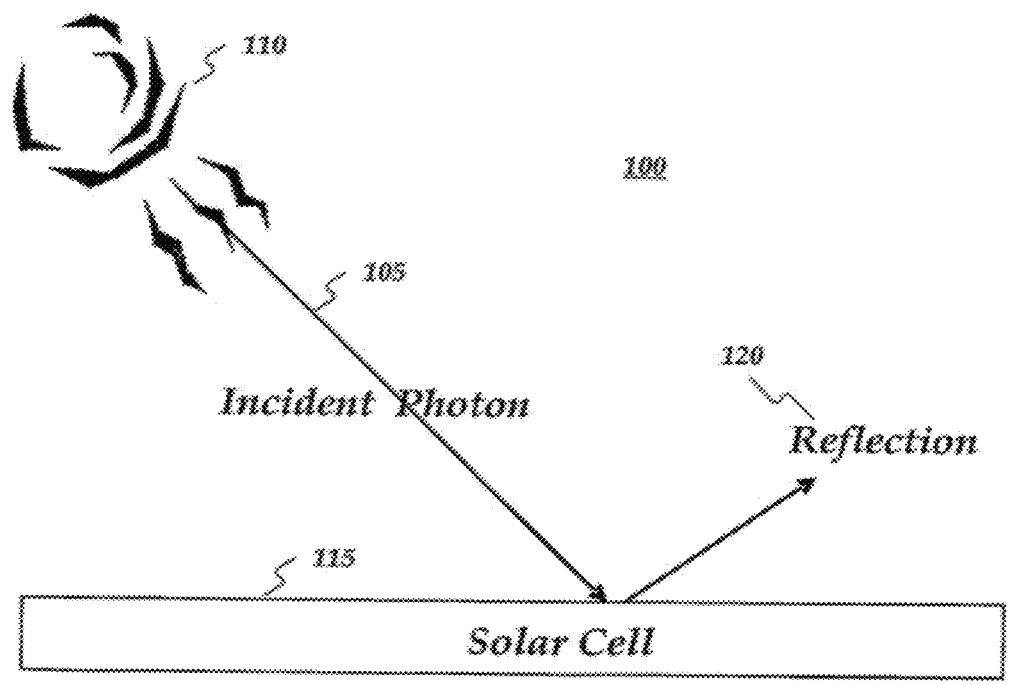
FIG. 1 is a block diagram of a photovoltaic device.

The following detailed description refers to the accompanying drawings. Wherever possible, the same reference numbers are used in the drawings and the following description to refer to the same or similar elements. While embodiments of the invention may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the invention. Instead, the proper scope of the invention is defined by the appended claims.

Photovoltaic solar cells tap the sun's limitless energy. Tapping such a limitless energy source could remedy the world's many energy dilemmas. Photovoltaic cells, for example, absorb energy from light and convert the absorbed energy to an electrical current. Multi-junction photovoltaic devices, consistent with embodiments of the invention, may comprise carbon nanotube (CNT) based photovoltaic cells that demonstrate efficiencies that exceed 50%. The aforementioned photovoltaic cells may comprise a small "footprint" due, for example, to the nanostructured topography of the photoactive surface. Photovoltaic devices, consistent with embodiments of the invention, may be light weight that may make them extremely beneficial for space applications where launch mass may be a major cost driver.

An embodiment consistent with the invention may comprise a three dimensional photovoltaic device. The photovoltaic device may comprise a first energy absorbing element configured to convert energy from a photon impinging the first energy absorbing element into a first electrical current. Furthermore, the photovoltaic device may comprise a second energy absorbing element being oriented with the first energy absorbing element in a non-parallel manner. The second energy absorbing element may be configured to convert energy from the photon impinging the second energy absorbing element into a second electrical current. The photon impinging the second energy absorbing element may do so after the photon impinged the first energy absorbing element.

Another embodiment consistent with the invention may comprise a photovoltaic device. The device may comprise a first energy absorbing surface and a second energy absorbing being substantially parallel to the first energy absorbing surface. The photovoltaic device may further comprise a third energy absorbing surface being substantially perpendicular to the first energy absorbing surface and the second energy absorbing surface. Each of the first energy absorbing surface, the second energy absorbing surface, and the third energy absorbing surface may be configured to convert energy from photons into electrical energy. The photons may be impinging one or more of the first energy absorbing surface, the second energy absorbing surface, and the third energy absorbing surface. The first energy absorbing surface, the second energy absorbing surface, and the third energy absorbing surface may be oriented in manner to cause the photons to bounce between two or more of the first energy absorbing surface, the second energy absorbing surface, and the third energy absorbing surface.

Figure 2:
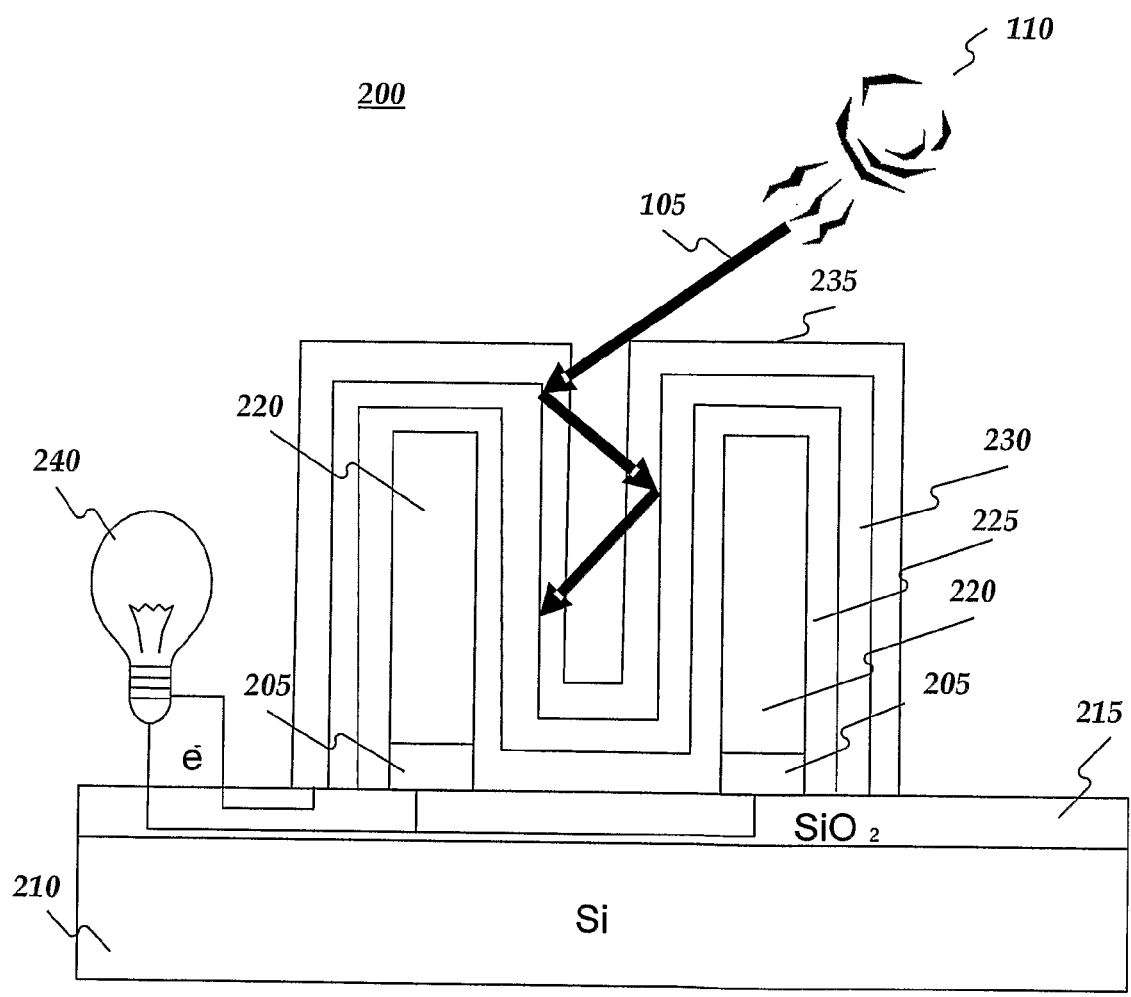
FIG. 2 is a block diagram of a three dimensional photovoltaic device.

FIG. 2 is a block diagram of a photovoltaic device 200 consistent with an embodiment of the invention. As shown in FIG. 2, catalyst metal sites 205 (e.g., Fe) may be deposited onto a silicon substrate 210 having an oxidized layer 215. CNT towers 220, composed, for example, of millions of CNTs, may be grown atop catalyst metal sites 205. CNT towers 220 may serve as a back contact for photovoltaic device 200. In other words, CNT towers 220 may serve as electrical conductors for electrical current produced by photovoltaic device 200. Sequential deposition of a first photoactive material 225 and a second photoactive material 230 may create, for example, a p/n-junction. The p/n-junction may comprise an energy absorbing element or layer configured to convert energy from a photon impinging the energy absorbing layer into electrical energy. A transparent conductive oxide (TCO) 235 may serve as the top contact for photovoltaic device 200. Photovoltaic device 200 may supply electrical energy to a load 240. As described in more detail below, consistent with embodiments of the invention, the energy absorbing layer may comprise, for example, cadmium telluride (CdTe/CdS). Embodiments of the invention, however, are not limited to CdTe and other materials may be used. In conventional systems, (e.g. single-junction solar cell 100) a light photon impinges, for example, a p/n-junction at a single instance and creates a single electron-hole pair. Then, any unabsorbed photons reflect into the atmosphere or space. Consistent with embodiments of the invention, however, multiple photon impingements upon photovoltaic device 200 allowing more photon energy absorption and can improve conversion efficiencies using a "light trapping" effect.

Figure 3:
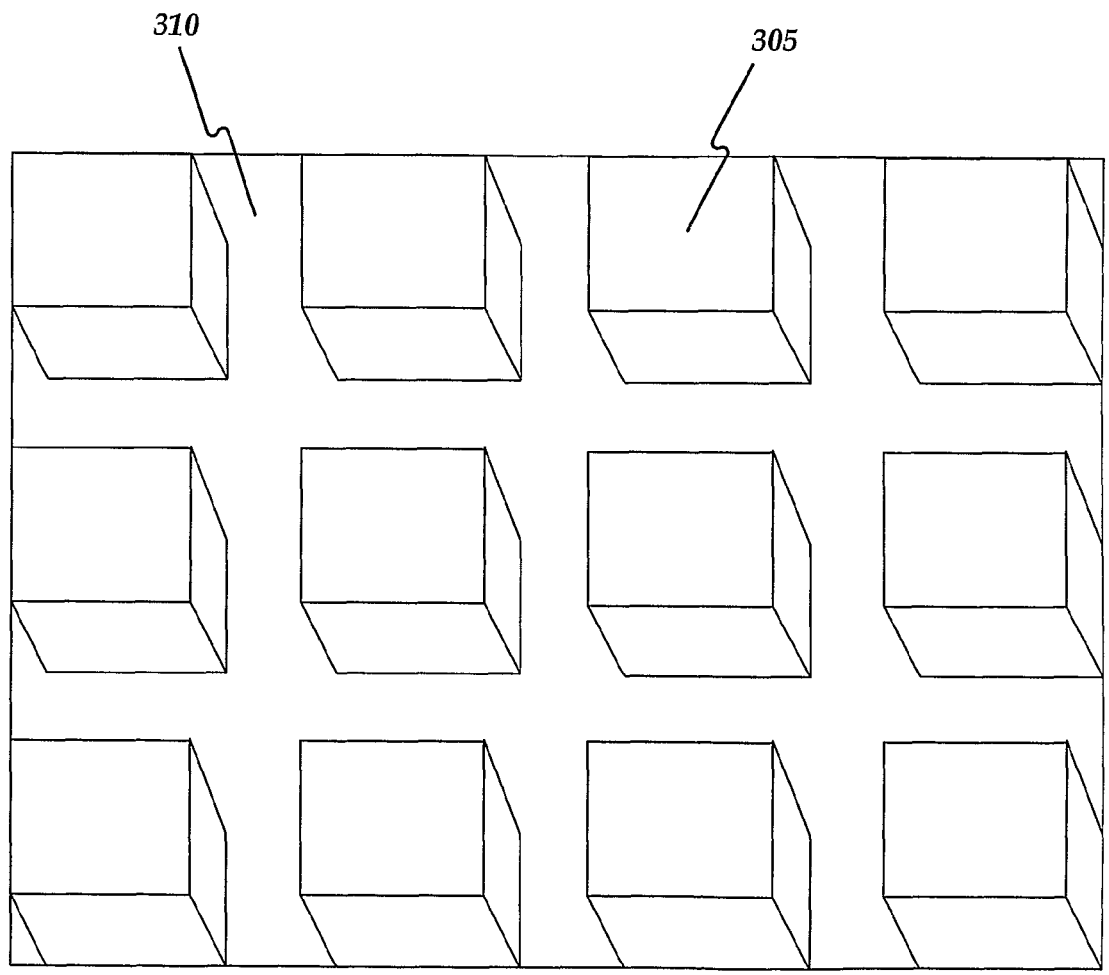
FIG. 3 is a diagram showing a three dimensionally aligned array of carbon nanotube (CNT) towers grown on a lithographically patterned wafer.

FIG. 3 is a diagram showing a three dimensionally aligned array 300 of CNT towers 305 grown on a lithographically patterned silicon (Si) wafer 310 consistent with an embodiment of the invention. Conductive CNT array 300 may then be coated with a suitable photon absorbing band gap materials (e.g. CdTe/CdS) to form, for example, a p/n-junction. A conductive oxide such as indium tin oxide (ITO) may then be deposited as the transparent top contact over the photon absorbing band gap materials. While FIG. 3 shows CNT towers 305 having a square shape, embodiments of the invention are not limited to this shape and may comprise any shape. Consistent with another embodiment of the invention, another three dimensionally aligned array (not shown) may comprise a relief of three dimensionally aligned array 300. For example, rather than being grown in the positions shown in FIG. 3, the CNTs may be grown in the space shown between the towers shown in FIG. 3. This relief of three dimensionally aligned array 300 may be similar to a multi-junction photovoltaic device 500 described below with respect to FIG. 5.

Consistent with embodiments of the invention, due to a three dimensional nanoscale topography approach, CNT-based photovoltaic devices may include orders of magnitude more surface area for an equivalent footprint compared to a conventional solar cell. For example, on each square centimeter of substrate supporting array 300 in FIG. 3, there may be 40,000 square CNT towers. If the CNT towers are grown on the substrate to be approximately 300 μm tail (e.g. CNT growth time of approximately 15 minutes), a p/n-junction surface area, for example, becomes approximately 20 cm$^2$. In other words, consistent with embodiments of the invention, an increase in an electron-hole pair generating surface area of 2,000% (1m$^2$=10,000 cm$^2$) may be realized with no net increase in "footprint." Although only a portion of the surface area may be available for an incident photon, once a reflection occurs, a "backside" pin-junction of the tower, for example, may be available to enable multiple photon impingements (i.e. "light trapping") as discussed above.

For a planar (i.e. one-dimensional) solar cell, performance may be maximized when photons from the sun impinge upon a p/n-junction perpendicularly. At angles away from normal, a cosine term may be used to account for the less than optimum angle of incidence of the photon upon the p/n-junction. Some systems use complicated mechanical systems to maintain this orthogonal arrangement of solar flux to the solar cell surface. Consistent with embodiments of the invention, a CNT-based structure may not follow these conventional concepts. For example, a perpendicular arrangement may minimize the amount of photon bounces and decrease light trapping. Off-axis photon impingement at a glancing angle may enable the photon to experience multiple bounces upon the p/n-junction. Consequently, absorption likelihood may be increased, thus increasing conversion efficiency.

Figure 4:
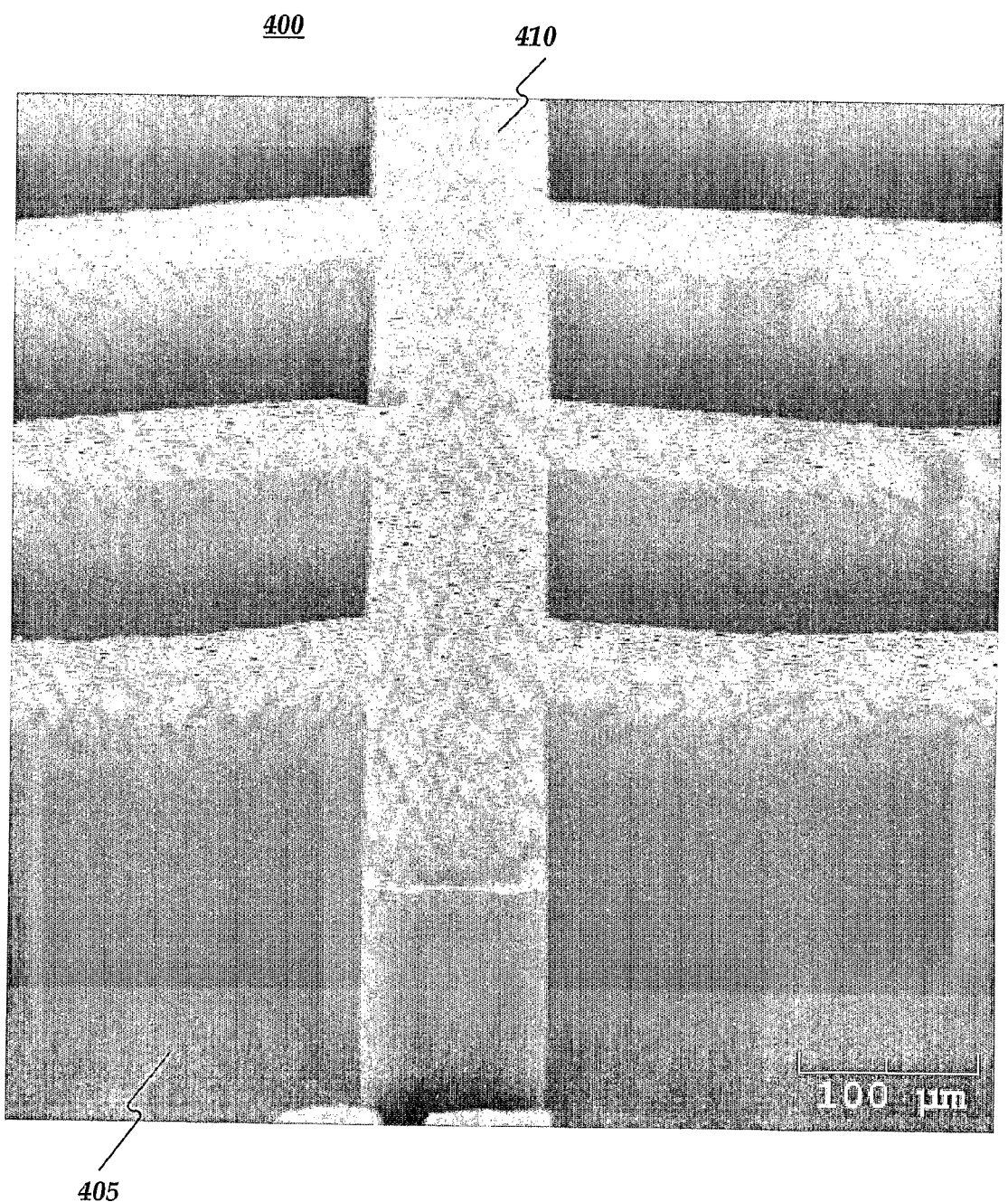
FIG. 4 is a diagram showing a three dimensional multi-junction photovoltaic device.

FIG. 4 is a diagram showing a three dimensional multi-junction photovoltaic device 400 consistent with an embodiment of the present invention. For example, a multi-junction device may include a planar device serving as bottom cell 405 and a p/n-coated CNT array 410 as a top cell. CNT towers in CNT array 410 may serve as a common terminal between bottom cell 405 and CNT array 410. Multi-junction photovoltaic device 400 enhances the "light-trapping" effect because the bottom cell may have a greater opportunity to absorb any "bounced" photons from CNT array 410. Furthermore, a fraction of the solar cell that was covered with opaque bus-bars in conventional systems (e.g. approximately 8% of the planar area) may be made photoactive, thus increasing power generation, for example, through increased p/n-junction surface area.

Figure 5:
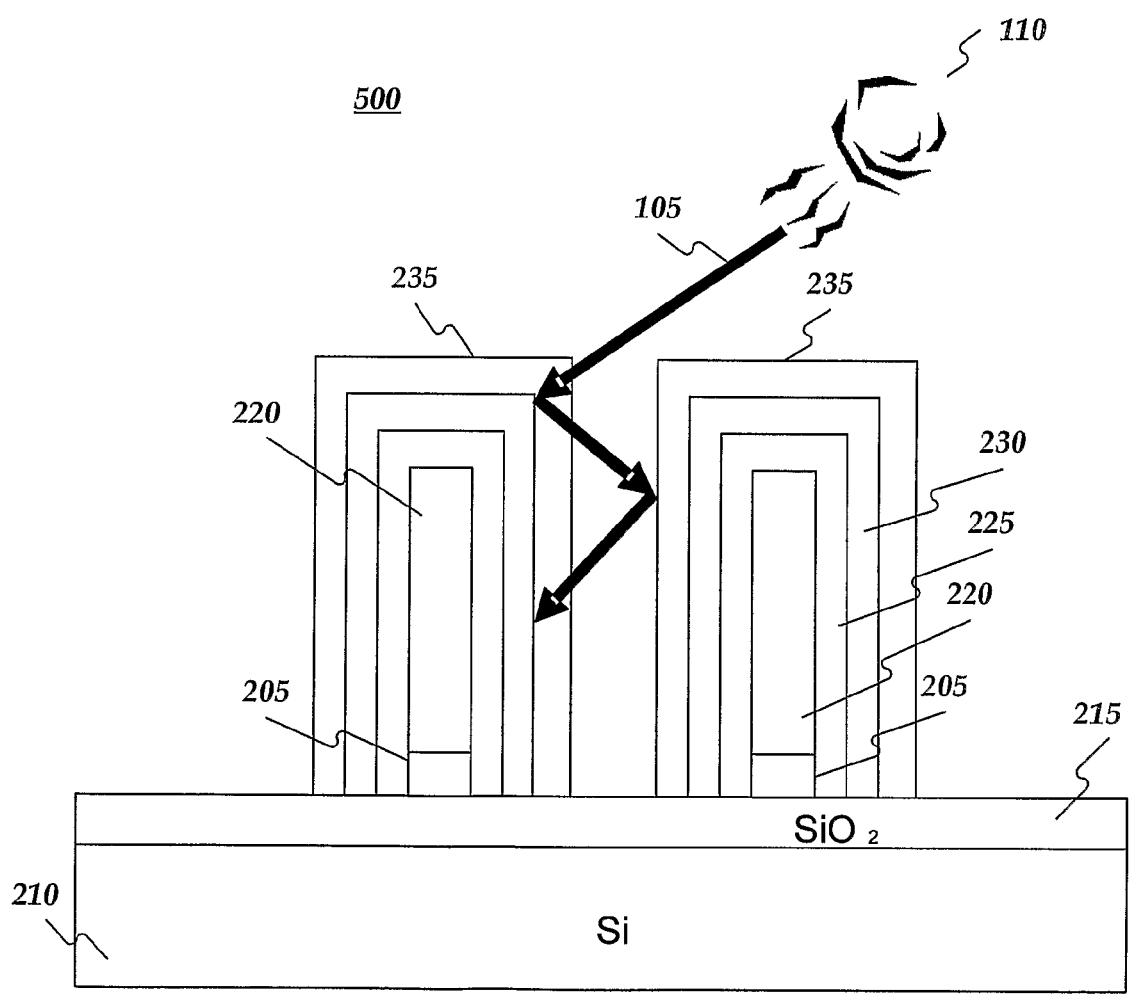
FIG. 5 is a diagram showing a three dimensional multi-junction photovoltaic device.

FIG. 5 is a diagram showing a three dimensional multi-junction photovoltaic device 500. Three dimensional multi-junction photovoltaic device 500 may be similar to photovoltaic device 200 shown in FIG. 2. However, as shown in FIG. 5, Si layer 210 may be exposed to impinging photons bouncing between CNT towers 220. In other words, photons may impinge both a first energy absorbing surface (e.g. a first junction) on CNT towers 220 to produce electrical energy and a second energy absorbing surface (e.g. a second junction) on Si layer 210 to produce electrical energy. For example, a photon may impinge a p/n-junction at a single instance on either of CNT towers 220 to create a single electron-hole pair. Then, any unabsorbed photons may be reflected and may eventually impinge Si layer 210. Si layer 210 and CNT towers 220 may have different band gap values. For example, CNT towers 220 may comprise CdTe and Si layer 210 may comprise Si.

Consistent with embodiments of the invention, the first energy absorbing surface (e.g. a first junction) and the second energy absorbing surface (e.g. a second junction) may be "tuned" to different photon energies. For example, a photon, in order to create an electron on an energy absorbing surface, must have a certain energy level. In other words, energy absorbing surfaces have a band gap. Impinging, photons, having an energy level above the energy absorbing surface's band gap, create an electron. Impinging photons, having an energy level below the energy absorbing surface's band gap, do not create an electron. CdTe may have a band gap of 1.53 electron volts (eV). Any photons having energy greater than 1.53 eV may excite an electron in a CdTe energy absorbing surface and may allow the excited electron to conduct. Silicon, on the other hand, may have a lower band gap of about 1.1 eV.

As shown in FIG. 5, photons may first impinge CNT towers 220 including a first energy absorbing surface that has a first band gap value. Then, the photons may impinge Si layer 210 including a second energy absorbing surface that has a second band gap value. The second band gap value may be smaller than the first band gap value. Materials with smaller band gap values may be more expensive and more difficult to construct. Consequently, a multi-unction photovoltaic device can be constructed to allow photons to first impinge the first energy absorbing surface and then allow reflected photons to impinge the second energy absorbing surface having a band gap lower that the first energy absorbing surface. In this way, multi-junction photovoltaic devices can use a less expensive easier to manufacture material to serve as the first energy absorbing surface. Photons that may not create electrons in the first energy absorbing surface may then be reflected to the second energy absorbing surface having a lower band gap in order to take advantage of the reflected photons' energy. Accordingly, consistent with embodiments of the invention, multiple photon impingements upon photovoltaic device 500 allow more photon energy absorption and can improve conversion efficiencies using a "light trapping" effect on multiple junctions.

As referenced above, CdTe may serve as the p-type material selected for use in a photovoltaic device consistent with embodiments of the invention (e.g. kg=1.53 eV). Molecular beam epitaxy (MBE) may be used to deposit a layer of multicrystalline CdTe. Layer thickness for optimum photon capture and carrier extraction may comprise 2 to 4 μm. The CNT towers described above may have approximately 4 μm thick CdTe coatings along the walls (where the bulk of the surface area is contained) and 10 μm on the "roof" of the tower. This difference may be due to a physical alignment between an evaporative source material and a substrate in an MBE chamber. Techniques such as rotating a sample at an offset angle may improve thickness uniformity between sidewall and top surfaces. Thickness reductions (e.g. to 2 μm) may be accomplished through reduced time in the MBE.

CdS ($E_g$=2.5 eV) may serve as an n-type material. It can be applied via chemical bath deposition (CBD) or MBE. Both techniques have advantages and disadvantages for potential insertion into an economically viable technology. The ideal thickness of the CdS coating may be 50 to 150 nm. CdSe ($E_g$=1.7 eV) can also be used as a photoactive material. The technique for applying the CNTs with CdSe may be a solution-based technique under commercial development by Flood of NewCyte, Inc., Oberlin, Ohio. CdSe could be used for a multi-junction device where the CdSe coated CNTs serve as the top cell grown on bus-bars while the bottom cell could be polysilicon cells ($E_g$=1.1 eV). The bandgap pairing between CdSe and Si may be efficient in a multi-junction device. Moreover, as described above, indium tin oxide (ITO) may be applied to photovoltaic device consistent with embodiments of the invention. For example, ITO may be used to form a transparent top contact. Evaporative and solution-based techniques to deposit the ITO onto the 3-D arrayed structure may be used.

Figure 6:
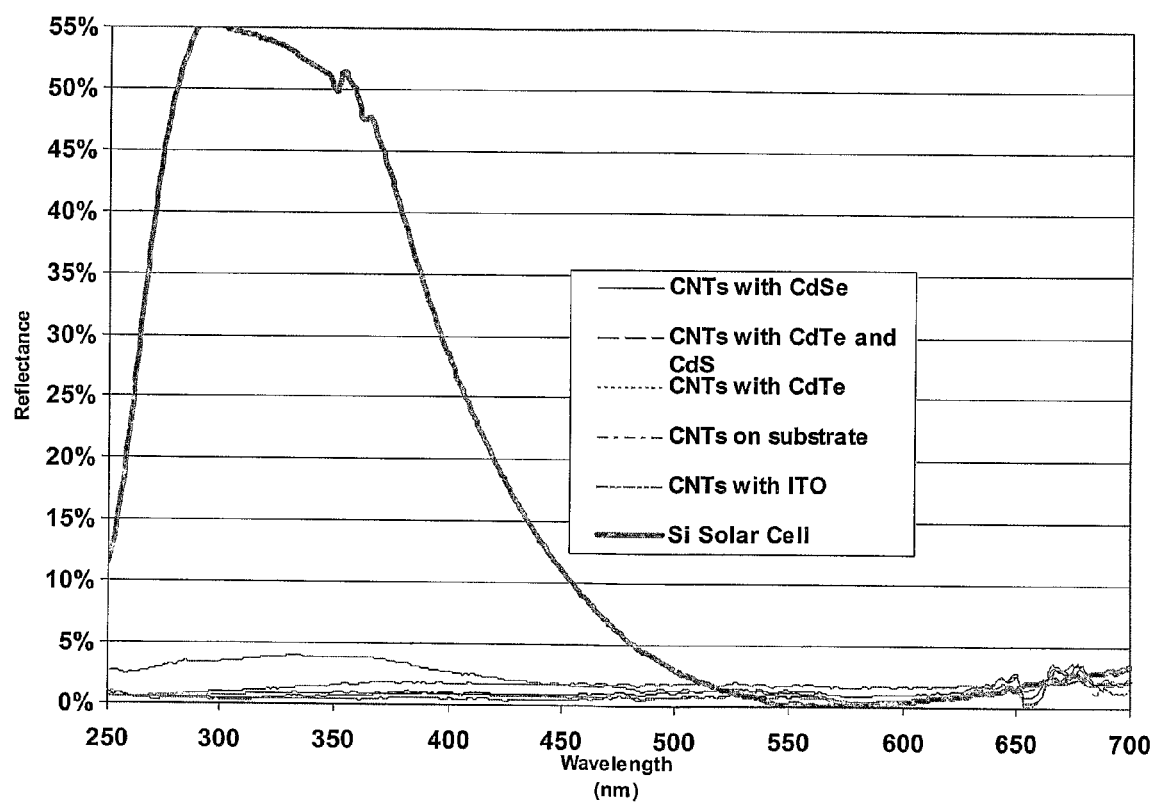
FIG. 6 is a graph illustrating light absorption.
Figure 7:
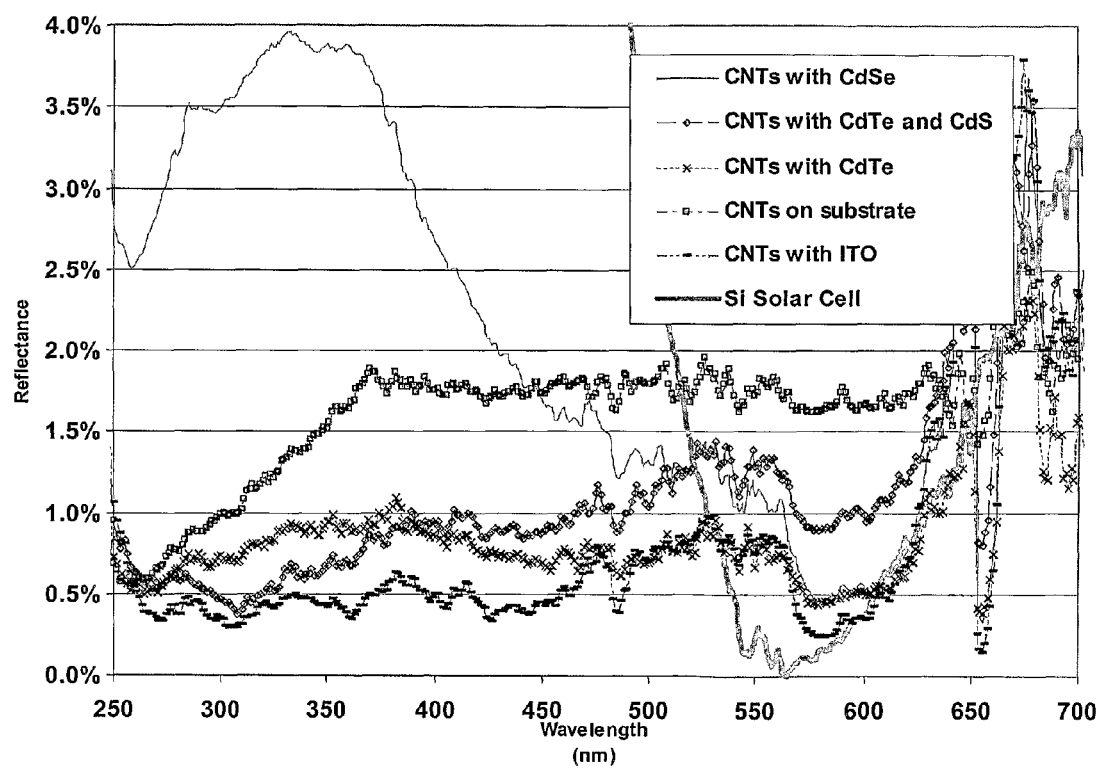
FIG. 7 is another graph illustrating light absorption.

FIG. 6 and FIG. 7 illustrate a high photon absorbing capacity of a photovoltaic device consistent with embodiments of the present invention. As shown in FIGS. 6 and 7, reflectance measurements may be taken on a variety of coated devices as described above. As shown in FIG. 6, an Si cell may exhibit significant reflection and thus allows for wasted photons. As shown in FIG. 7, an expansion of the scale shows that reflectance from photovoltaic devices consistent with embodiments of the present invention may be less than 1.5%, thus demonstrating the light trapping concept described above.

Consistent with embodiments of the invention, CNT tower shape may be optimized. For example, a square structure may not be ideal for optimum reflection and light trapping. A multi-faceted CNT tower (i.e., star shaped) may have greater surface area and may offer enhanced light trapping capabilities. Furthermore, a CNT cylindrical tower may allow for uniformity and less internal stress within p/n-type materials. These stresses could induce dislocations that may serve as recombination centers for electron-hole pairs and could degrade photovoltaic device efficiency.

Consistent with embodiments of the invention, p/n-type layers may be optimized. For example, with any photoactive material, performance gains may be realized by maximizing both photon absorption and electron-hole carrier extraction. CdTe may be used as the p-type material and CdS as the n-type material. Grain refinement and annealing of the CdTe structure may be important to prevent inadvertent electron-hole recombination. One of the principle processes for CdTe grain refinement may be via $CdCl_2$ treatment and thermal annealing. This compound may be used in a CBD process for CdS application. In addition, a hexagonal CNT structure may encourage preferential growth of the hexagonal close packed (HCP) structure for the CdTe.

The use of MBE may have a line-of-sight limitation in creating uniform top and sidewall thicknesses. Implementation of a rotating and slightly angled substrate holder could allow more uniform coverage of the evaporated material. In addition, the CdTe thin film thickness optimization may be based on calculations for planar structures. Embodiments of the invention may have a different optimized thickness for CdTe to allow for maximized photon absorption and carrier extraction.

In addition, consistent with embodiments of the invention, other p/n-type materials may be used, for example, doped-Si, InGaP, GaAs, GaN, CdSe, CIGS, and CIS. The aforementioned p/n-type materials are examples, and others may be used. The use of other p/n-type materials may be used for outer space applications where radiation effects upon thin film generate defects that may degrade performance over time. Furthermore, consistent with embodiments of the invention, because certain CNTs may be semiconducting, the p/n-type material may be eliminated entirely and the CNT array itself may be used as both the photon absorbing band gap material and the carrier conducting material.

Consistent with embodiments of the invention a top contact of a photovoltaic device may be optimized. For example, the ITO top contact that serves as the TCO may be optimized. This contact may offer high conductivity with underlying photoactive layers to extract the carriers before recombination can occur.

In addition, very low series resistance and high optical transmission may be required so that it affords little impediment to charge carrier transport or photon absorption. Other top contact materials could also be used. For example, if CdSe were used as the photoactive species, it could be paired with SnO. This combination may offer a simplified layering and a more efficient structure resulting from alignment of the SnO Fermi level with the CdSe conduction band edge.

Consistent with embodiments of the invention, a bottom contact of a photovoltaic device may be optimized. The bottom contact may be formed by a CNT tower. The bottom contact resistance losses may degrade efficiency. These contact losses may be between the band gap material and the CNT or between the CNT and the metallic circuit contact on the substrate. Embodiments of the invention may minimize these losses.

The CNT tower may be composed of 100% "arm-chair" single wall carbon nanotubes (SWNTs) that may offer high efficiency "ballistic" conduction to extract carriers from overlying photoactive materials. Attaining chairal control may be difficult, thus a statistical blend of arm chair, "zigzag," and other semiconducting CNTs with varying band gaps may be generated. Consistent with embodiments of the invention, for example, this effect may be overcome by using a multitude (many millions) of CNTs aligned in parallel to form each tower. The multiplicity of parallel conduction paths may overwhelm the losses that may result from the semiconducting CNTs.

Furthermore, the band gap of the semiconducting CNTs may be tailored to allow photon absorption and thereby may serve as a substitute for p/n-type layers. From a production economics standpoint, the elimination of the p/n-type layering processes may allow for more economic designs and manufacturing processes. Furthermore, consistent with embodiments of the invention, if the periodicity of a nanotube patterns is tuned to a resonant frequency of the incident light, a photonic crystal may be generated. Consequently, a photon's wave-like properties may be exploited. Accordingly, absorption and light trapping may be further enhanced.

While certain embodiments of the invention have been described, other embodiments may exist. Further, the disclosed methods' stages may be modified in any manner, including by reordering stages and/or inserting or deleting stages, without departing from the invention. While the specification includes examples, the invention's scope is indicated by the following claims. Furthermore, while the specification has been described in language specific to structural features and/or methodological acts, the claims are not limited to the features or acts described above. Rather, the specific features and acts described above are disclosed as example for embodiments of the invention.

What is claimed is:

1. A photovoltaic device comprising:
   a first energy absorbing element configured to convert energy from a photon impinging the first energy absorbing element into a first electrical current; and
   a second energy absorbing element being oriented with the first energy absorbing element in a non-parallel manner, the second energy absorbing element configured to convert energy from the photon impinging the second energy absorbing element into a second electrical current, the photon impinging the second energy absorbing element after the photon impinged the first energy absorbing element, each energy absorbing element having a top contact extending therealong, wherein a surface of the top contact extending along the first energy absorbing element is oriented in a non-parallel manner with a surface of the top contact extending along the second energy absorbing element, wherein the first energy absorbing element overlies a metallic core.

2. The photovoltaic device of claim 1, wherein the first energy absorbing element and the second energy absorbing element have different band gap values.

3. The photovoltaic device of claim 1, wherein the first energy absorbing element comprises cadmium telluride (CdTe).

4. The photovoltaic device of claim 1, wherein the second energy absorbing element comprises silicon (Si).

5. A photovoltaic device comprising:
   a first energy absorbing element configured to convert energy from a photon impinging the first energy absorbing element into a first electrical current; and
   a second energy absorbing element being oriented with the first energy absorbing element in a non-parallel manner, the second energy absorbing element configured to convert energy from the photon impinging the second energy absorbing element into a second electrical current, the photon impinging the second energy absorbing element after the photon impinged the first energy absorbing element, each energy absorbing element having a top contact extending therealong, wherein a surface of the top contact extending along the first energy absorbing element is oriented in a non-parallel manner with a surface of the top contact extending along the second energy absorbing element,
   wherein the first energy absorbing element comprises a carbon nanotube configured to provide structure to the first energy absorbing element.

6. A photovoltaic device comprising:
a first energy absorbing element configured to convert energy from a photon impinging the first energy absorbing element into a first electrical current; and
a second energy absorbing element being oriented with the first energy absorbing element in a non-parallel manner, the second energy absorbing element configured to convert energy from the photon impinging the second energy absorbing element into a second electrical current, the photon impinging the second energy absorbing element after the photon impinged the first energy absorbing element, each energy absorbing element having a top contact extending therealong, wherein a surface of the top contact extending along the first energy absorbing element is oriented in a non-parallel manner with a surface of the top contact extending along the second energy absorbing element,
wherein the first energy absorbing element comprises a carbon nanotube configured to provide a conductor for the first electrical current.

7. The photovoltaic device of claim 1, wherein the first energy absorbing element and the second energy absorbing element are substantially perpendicular.

8. The photovoltaic device of claim 1, wherein at least one of: the first energy absorbing element comprises a substantially flat first surface and the second energy absorbing element comprises a substantially flat second surface.

9. The photovoltaic device of claim 1, further comprising a third energy absorbing element configured to convert energy from the photon impinging the third energy absorbing element into a third electrical current, the third energy absorbing element being substantially parallel to the first energy absorbing element and substantially perpendicular to the second energy absorbing element, the first energy absorbing element, the second energy absorbing element, and the third energy absorbing element being oriented in manner to cause the photon to bounce between the first energy absorbing element, the second energy absorbing element, and the third energy absorbing element.

10. The photovoltaic device of claim 1, wherein the first and second energy absorbing elements are positioned relative to each other such that the photon bounces off of the first energy absorbing element prior to impinging the second energy absorbing element.

11. The photovoltaic device of claim 1, wherein the first and second energy absorbing elements are positioned relative to each other such that the photon changes direction upon impinging the first energy absorbing element prior to impinging the second energy absorbing element.

12. The photovoltaic device of claim 1, further comprising a third energy absorbing element oriented substantially parallel to the first energy absorbing element and spaced therefrom, wherein the first and third energy absorbing elements are positioned relative to each other such that the photon bounces off of the first energy absorbing element and impinges the third energy absorbing element prior to impinging the second energy absorbing element.

13. The photovoltaic device of claim 12, wherein the photon travels through a void positioned between the first and third energy absorbing elements such that the photon travels through the void after impinging the first energy absorbing element and prior to impinging the third energy absorbing element.

14. The photovoltaic device of claim 1, wherein the photon travels through a void positioned between the first and second energy absorbing elements such that the photon travels through the void after impinging the first energy absorbing element and prior to impinging the second energy absorbing element.

15. The photovoltaic device of claim 1, wherein the first energy absorbing element is a conductive tower, the conductive tower being configured to provide a conductor for the first electrical current.

16. The photovoltaic device of claim 15, wherein the conductive tower is metallic.

17. The photovoltaic device of claim 15, wherein the conductive tower has a cylindrical profile.

18. The photovoltaic device of claim 15, wherein the first energy absorbing element comprises a material selected from a group consisting of doped-Si, InGaP, GaAs, GaN, CdSe, CIGS, and CIS.

19. The photovoltaic device of claim 15, wherein the tower is a core of the first energy absorbing element.

20. The photovoltaic device of claim 1, wherein the first energy absorbing element comprises a conductive nanotube configured to provide a conductor for the first electrical current.

21. The photovoltaic device of claim 1, wherein the first energy absorbing element comprises a conductive nanotube configured to provide structure for the first electrical current.

22. The photovoltaic device of claim 15, wherein the first energy absorbing element comprises Si.

23. The photovoltaic device of claim 1, wherein the first energy absorbing element is positioned relative to the second energy absorbing element to reflect the photon from the first energy absorbing element towards the second energy absorbing element.

* * * * *